United States Patent [19]

Kimura

[11] Patent Number: 5,625,593
[45] Date of Patent: Apr. 29, 1997

[54] MEMORY CARD CIRCUIT WITH SEPARATE BUFFER CHIPS

[75] Inventor: Masatoshi Kimura, Hyogo-ken, Japan

[73] Assignee: Mitsubishi Denki Kabushiki Kaisha, Tokyo, Japan

[21] Appl. No.: 392,290

[22] Filed: Feb. 22, 1995

Related U.S. Application Data

[63] Continuation of Ser. No. 23,424, Feb. 23, 1993, abandoned, which is a continuation of Ser. No. 760,845, Sep. 17, 1991, Pat. No. 5,245,582, which is a continuation of Ser. No. 500,180, Mar. 28, 1990, abandoned.

[51] Int. Cl.$^6$ ............................................. G11C 7/00
[52] U.S. Cl. .................... 365/189.05; 365/52; 365/63; 365/72; 365/229; 365/230.08; 235/441; 235/442
[58] Field of Search ......................... 365/226, 227, 365/228, 229, 230.08, 52, 63, 189.05, 230.06, 72; 307/475, 443; 235/441, 442

[56] References Cited

U.S. PATENT DOCUMENTS

| | | |
|---|---|---|
| 4,007,355 | 2/1977 | Moreno . |
| 4,288,865 | 9/1981 | Graham . |
| 4,591,742 | 5/1986 | Morito . |
| 4,766,572 | 8/1988 | Kobayashi ................... 365/189.05 |
| 4,800,533 | 1/1989 | Arakawa . |
| 4,912,346 | 3/1990 | Mizuta . |
| 4,962,485 | 10/1990 | Kato et al. . |
| 4,985,870 | 1/1991 | Faraci . |
| 4,990,760 | 2/1991 | Tomari et al. . |
| 5,016,223 | 5/1991 | Kimura et al. . |
| 5,058,074 | 10/1991 | Sakamoto . |

FOREIGN PATENT DOCUMENTS

| | | |
|---|---|---|
| 1-112455 | 5/1989 | Japan . |
| 1-112456 | 5/1989 | Japan . |

OTHER PUBLICATIONS

Nikkei Electronics 1985, 12. 16, pp. 249–262.

*Primary Examiner*—Joseph E. Clawson, Jr.
*Attorney, Agent, or Firm*—Lowe, Price, LeBlanc & Becker

[57] ABSTRACT

A conventional memory card circuit has a construction where an input terminal and an output terminal of storage means are directly connected with a terminal unit. In consequence, the conventional memory card circuit has a disadvantage that the stored content of the storage means might be damaged when a signal applied from the terminal unit is unstable at the time of inserting or detaching a memory card into or from the terminal unit. Therefore, according to the present invention, a buffer is provided in each of input and output terminals of storage means and the storage means is cut off from outside by the buffer at the time of inserting or detaching a memory card into or from a terminal unit, whereby the stored content of the storage means can be prevented from being damaged.

23 Claims, 5 Drawing Sheets

TERMINAL UNIT

TERMINAL UNIT 5,625,593

MEMORY CARD CIRCUIT WITH SEPARATE BUFFER CHIPS

This application is a continuation in part of application Ser. No. 08/023,424, abandoned, filed Feb. 23, 1993, which is a continuation application of Ser. No. 07/760,845 filed Sep. 17, 1991, U.S. Pat. No. 5,245,582, which is a continuation of Ser. No. 07/500,180 filed Mar. 28, 1990, abandoned

BACKGROUND OF THE INVENTION

1. Field of the Invention

The present invention relates to memory card circuits and particularly to a circuit provided in a portable memory card such as an IC card.

2. Description of the Background Art

Portable cards having a memory function (hereinafter called memory cards) such as IC cards are known in the prior art. Such a memory card has a semiconductor integrated circuit device having a memory function mounted on a card medium formed of synthetic resin or the like. A memory card is usually carried by a user and it is inserted in terminal units of various systems when it is used. Thus, the terminal unit and the semiconductor integrated circuit device of the memory card are electrically connected so that various data processing can be performed between the terminal unit and the memory card. For example, a semiconductor memory contained in a semiconductor integrated circuit device of a memory card is accessed by a terminal unit, whereby the content of the memory is read or rewritten.

FIG. 1 is a circuit diagram showing a construction of a conventional memory card circuit mounted in a memory card. Referring to FIG. 1, a static RAM group 1 has a plurality of static RAM's (hereinafter referred to as SRAM's) 2a to 2n. An address decoder 3 generates an SRAM selection signal based on address data supplied from a terminal unit, not shown, through an address bus 8 and a chip enable signal $\overline{CE}$ supplied from the terminal unit through a signal line 9. This SRAM selection signal serves to select any one of the SRAM's 2a to 2n and it is applied to $\overline{CE}$ terminals (chip enable terminals) of the respective SRAM's 2a to 2n through signal lines 13a to 13n. A write enable signal $\overline{WE}$ is applied to $\overline{WE}$ terminals (write enable terminals) of the respective SRAM's 2a to 2n through a signal line 10 from the terminal unit and an output enable signal $\overline{OE}$ is applied to $\overline{OE}$ terminals (output enable terminals) thereof through a signal line 11 from the external unit. The SRAM's 2a to 2n are connected to an I/O data bus 12. A power supply input line 14 receiving input of power from an external power supply on the side of the terminal unit is connected to an internal power supply line 15 through a diode 16. When the power supply input line 14 is in a cutoff state (a state where it does not receive input of power from the terminal unit) as in the case where the user is carrying the card, a battery 6 operates to supply electric current to the internal power supply line 15 through a resistor 5 and a protection diode 4. Thus, the battery 6 is used as an internal power supply for backup of the SRAM's 2a to 2n. A capacitor 7 is provided between the internal power supply line 15 and the ground. A pull-up resistor 17 is provided between the internal power supply line 15 and the signal lines 9, 10. The signals $\overline{CE}$, $\overline{WE}$, $\overline{OE}$ are "L" active signals (i.e., signals rendered active at low ("L") level).

The conventional memory card circuit shown in FIG. 1 has a minimum necessary construction for a circuit of a memory card and it is generally well known. The respective SRAM's 2a to 2n of the SRAM group 1 are directly connected to the terminal unit (not shown) through the address bus 8, the signal lines 10, 11 and the I/O data bus 12 so as to communicate data or signals with the terminal unit. Thus, each of the SRAM's 2a to 2n is constructed to be directly accessed from the terminal unit. Accordingly, when any one of the SRAM's is selected by the SRAM selection signal from the address decoder 3, the SRAM group 1 performs in principle just the same operation as individual operation of a general single SRAM.

In the following, operation of the conventional memory card circuit shown in FIG. 1 will be described.

First of all, description will be made of a case where no power input is applied from a terminal unit to the power supply input line 14 as in the case of the card being carried by a user. In this case, voltage of the battery 6 is supplied to the respective SRAM's 2a to 2n and the address decoder 3 through the resistor 5 and the protection diode 4. At this time, the address decoder 3 is in a non-operating state since an $\overline{E}$ terminal (enable terminal) thereof is pulled up to high ("H") level through the resistor 17. Accordingly, the SRAM selection signals provided from the address decoder 3 to the signal lines 13a to 13n are all at "H" level. Thus, the SRAM's 2a to 2n are all in a non-selective state. The I/O data bus 12 connected to the respective SRAM's 2a to 2n is in a floating state. Thus, the data stored in the SRAM's 2a to 2n can be maintained without being erased.

Next, description will be made of a case where power supply voltage is supplied from the power supply input line 14 from a terminal unit (not shown) into which a memory card is inserted. The power supply voltage supplied to the power supply input line 14 is supplied to the internal power supply line 15 through the diode 16. In general, the voltage of the internal power supply line 15 in this case is set larger than the voltage of the battery 6 and accordingly the connection between the internal power supply line 15 and the battery 6 is cut off by means of the protection diode 4. Consequently, electric current does not flow in the battery 6 and there is no consumption of power of the battery 6.

Since read and write operations of the SRAM's 2a to 2n are the same as the operations of a single general SRAM as described previously, only a brief description thereof will be given in the following.

First of all, address data is inputted to the address bus 8 from a terminal unit not shown and it is supplied to the address decoder 3 and the SRAM's 2a to 2n. The address decoder 3 decodes the address data and sets only the SRAM selection signal applied to a corresponding SRAM 2k (any one of 2a to 2n) to an active state, namely "L" level. The address decoder 3 sets the above mentioned SRAM selection signal to the active state only when the chip enable signal $\overline{CE}$ supplied through the signal line 9 is at "L" level. Now, let us assume that the corresponding SRAM 2k is selected by the address decoder 3. In other words, it is assumed that the $\overline{CE}$ terminal of the SRAM 2k is at "L" level. It is possible to write data into a storage area of the SRAM 2k from the terminal unit (through the I/O data bus 12) by setting a write enable signal $\overline{WE}$ to "L" level in a period of "L" level of the chip enable signal $\overline{CE}$. In this case, an output enable signal $\overline{OE}$ is set to "H" level. It is possible to read the data from the storage area of the SRAM 2k by setting the output enable signal $\overline{OE}$ to "L" level in a period of "L" level of the chip enable signal $\overline{CE}$. In this case, the write enable signal $\overline{WE}$ is set to "L" level. If the chip enable signal $\overline{CE}$ inputted to the signal line 9 is raised to "H" level, the I/O data bus 12 of the SRAM's 2a to 2n is brought into the floating state, making it impossible to read or write any data. Those operations are the same as the operation of a single general SRAM and therefore well known.

It is pointed that the conventional memory card circuit shown in FIG. 1 has the below described problems (1) to (5).

(1) The respective SRAM's 2a to 2n are connected directly to a terminal unit through the address bus 8, the signal lines 9 to 11 and the I/O data bus 12 so as to communicate data and signals with the terminal unit. Consequently, when a memory card is inserted into or taken out from a terminal unit which is in operation (namely, in a conducted state), irregularities occur in the levels of the input/output signals of the respective SRAM's 2a to 2n due to a defective contact, a transient phenomenon or the like in a portion of connection between the memory card and the terminal unit. More specifically, when the card is inserted into or detached from the terminal unit, the respective input/output signals do not change with the same level and differences occur in a short time. As a result, the data stored in the SRAM's 2a to 2n would be damaged.

(2) In case where input of power from the terminal unit to the power supply input line 14 is interrupted while the terminal unit and the memory card are connected, electric current from the battery 6 flows into the terminal unit through the resistor 5, the protection diode 4 and the pull-up resistor 17 if the potential of the signal line 9 or the signal line 10 is "L" level. As a result, the battery 6 has discharged and consumed instantaneously.

(3) Since the respective SRAM's 2a to 2n are constructed to be directly connected with a terminal unit, electrostatic strength of the memory card depends on electrostatic strength of each SRAM.

(4) Since input/output impedance of the memory card which is carried with the user depends on impedances of the respective single SRAM's 2a to 2n and the address decoder 3, the input/output impedance of the memory card is generally a very high impedance. Consequently, the electrostatic strength and electromagnetic filed strength of the memory card are low values.

(5) If the number of SRAM's included in the SRAM group 1 is increased, the input/output capacitance of each signal in the signal lines 9 to 11 and the I/0 data bus 12 increases. As a result, the rise and fall periods of each signal become very long and the rated values of the respective SRAM's 2a to 2n are not satisfied. Consequently, the electric performance of the memory card is considerably deteriorated.

SUMMARY OF THE INVENTION

An object of the present invention is to provide a memory card circuit where a stored content of storage means in a memory card can be reliably protected if the memory card is inserted into or taken out from a terminal unit when the terminal unit is in an active state.

Another object of the present invention is to provide a memory card circuit where a stored content of storage means in a memory card can be reliably protected even if power supply voltage supplied from a terminal unit to the memory card circuit is unstable.

Still another object of the present invention is to provide a memory card circuit where a backup internal power supply is prevented from discharging electricity to a terminal unit even if input of power supply from the terminal unit to the memory card is interrupted when the terminal unit and the memory card are connected.

A further object of the present invention is to provide a memory card circuit of a high reliability having excellent characteristics in electrostatic strength and electromagnetic field strength.

A memory card circuit according to the present invention is provided in a portable card medium and when the card medium is inserted into a terminal unit, it is electrically connected with the terminal unit to process data. The memory card circuit comprises storage means, buffer means and buffer control means. The storage means can be accessed from a terminal unit when the card medium is inserted into the terminal unit. The buffer means is provided in an input terminal and an output terminal of the storage means to provide an interface for transmission of data and signals between the terminal unit and the storage means. The buffer control means enables transmission of data and signals between the terminal unit and the storage means by conducting the buffer means when input of electric power from the terminal unit is equal to or higher than a prescribed voltage value, and cuts off the storage means from the external unit by bringing the buffer means into a non-conductive state when the input of electric power from the terminal unit is less than the prescribed voltage value.

According to the present invention, when the input of power from the terminal unit is less than the prescribed voltage value, the buffer means is brought into the non-conductive state by the buffer control means, whereby the storage means is cut off from outside. Consequently, if the input of power from the terminal unit is unstable as in cases of inserting and taking out the memory card into and from the terminal unit for example, the stored content of the storage means can be prevented from being damaged undesirably.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
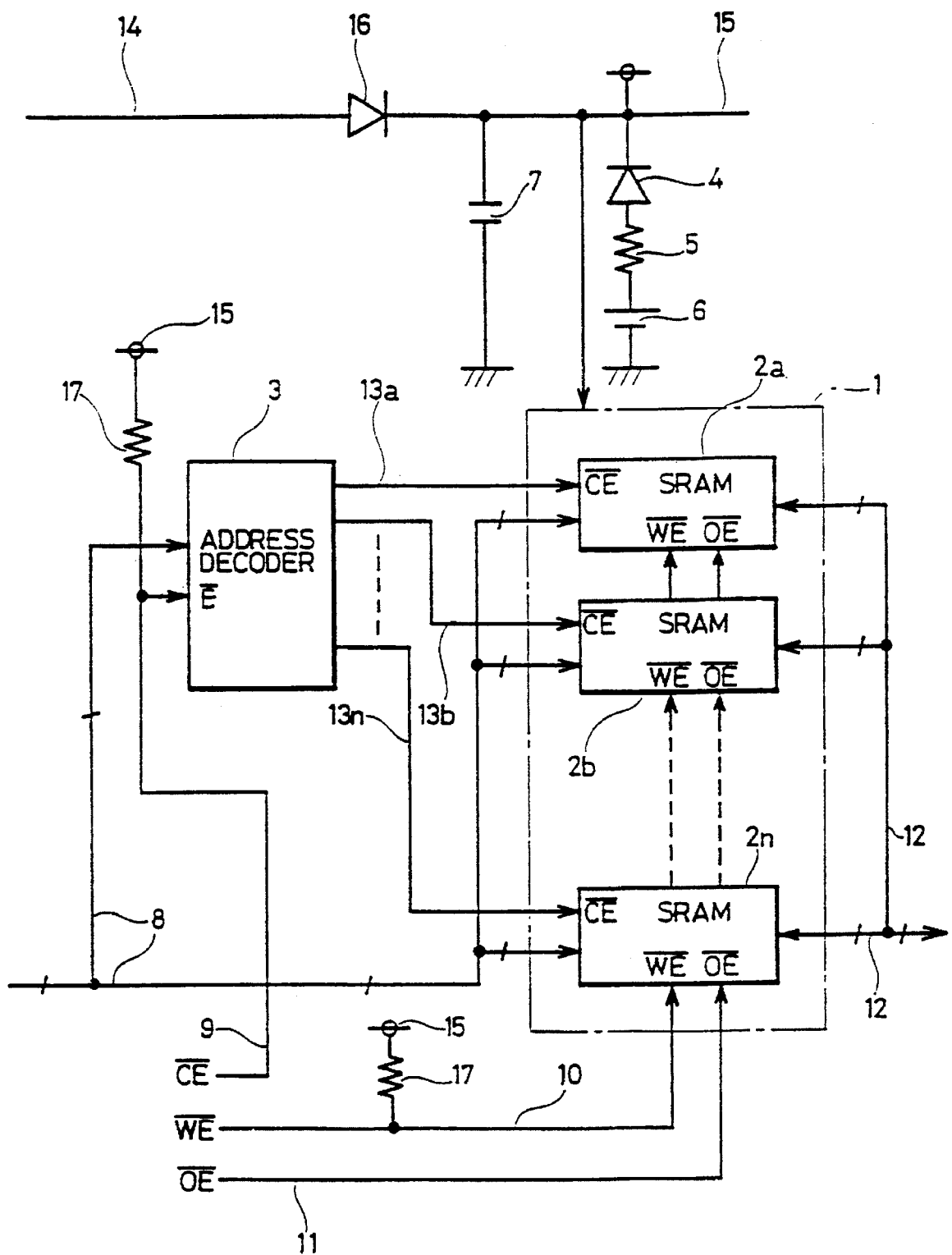
FIG. 1 is a circuit diagram showing a construction of a conventional memory card circuit.
Figure 2:
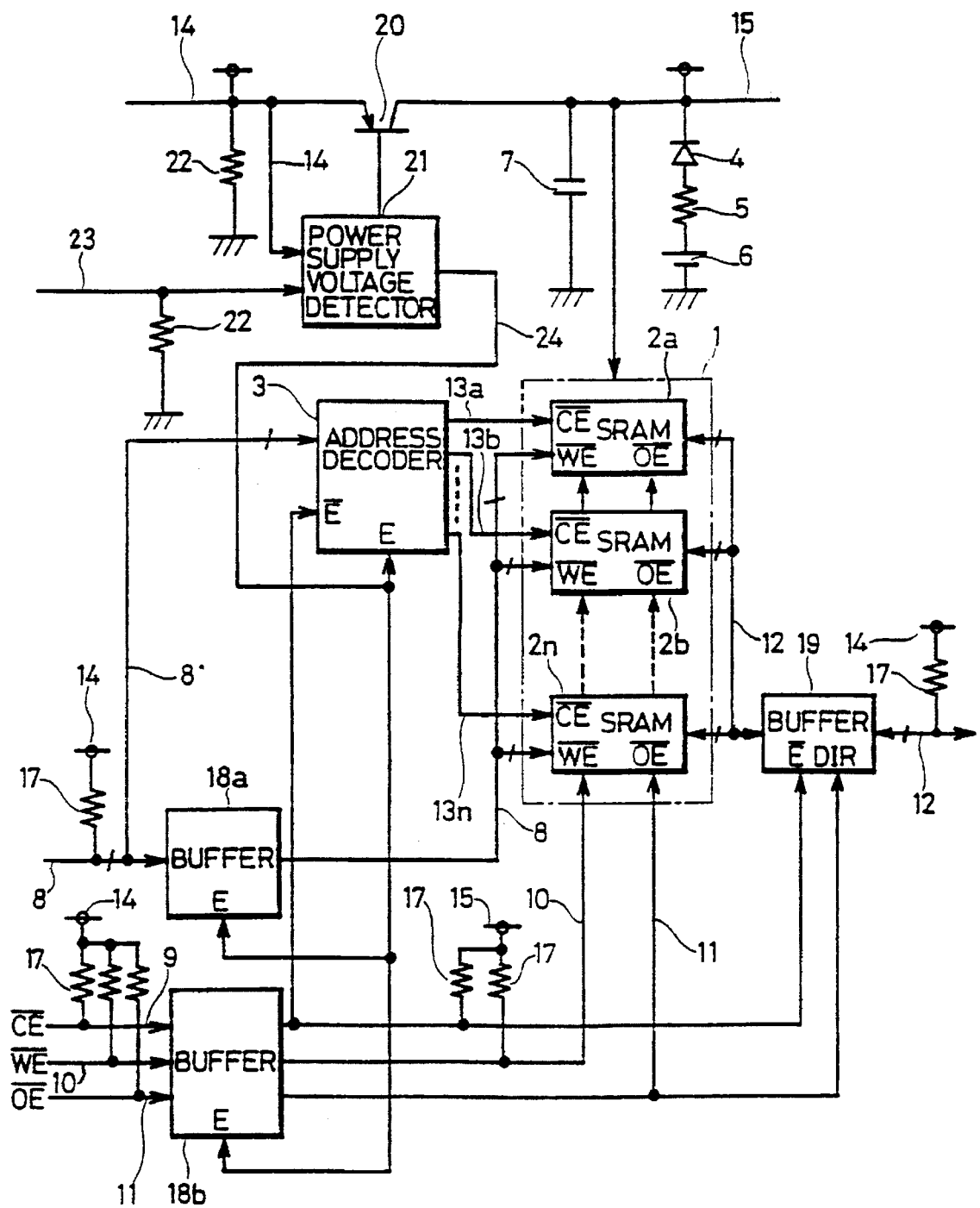
FIG. 2 is a circuit diagram showing a construction of an embodiment of the present invention.

Referring first to FIG. 2, a construction of a memory card circuit according to an embodiment of the present invention will be described. The construction of the embodiment of FIG. 2 is similar to that of the conventional memory card circuit of FIG. 1, except for the below described features. The portions corresponding to those in FIG. 1 are assigned identical reference numerals and the description thereof is not repeated. Referring to FIG. 2, an address bus 8 is connected to an address input terminal of each of SRAM's 2a to 2n through a unidirectional three-state buffer 18a.

Figure 2A:
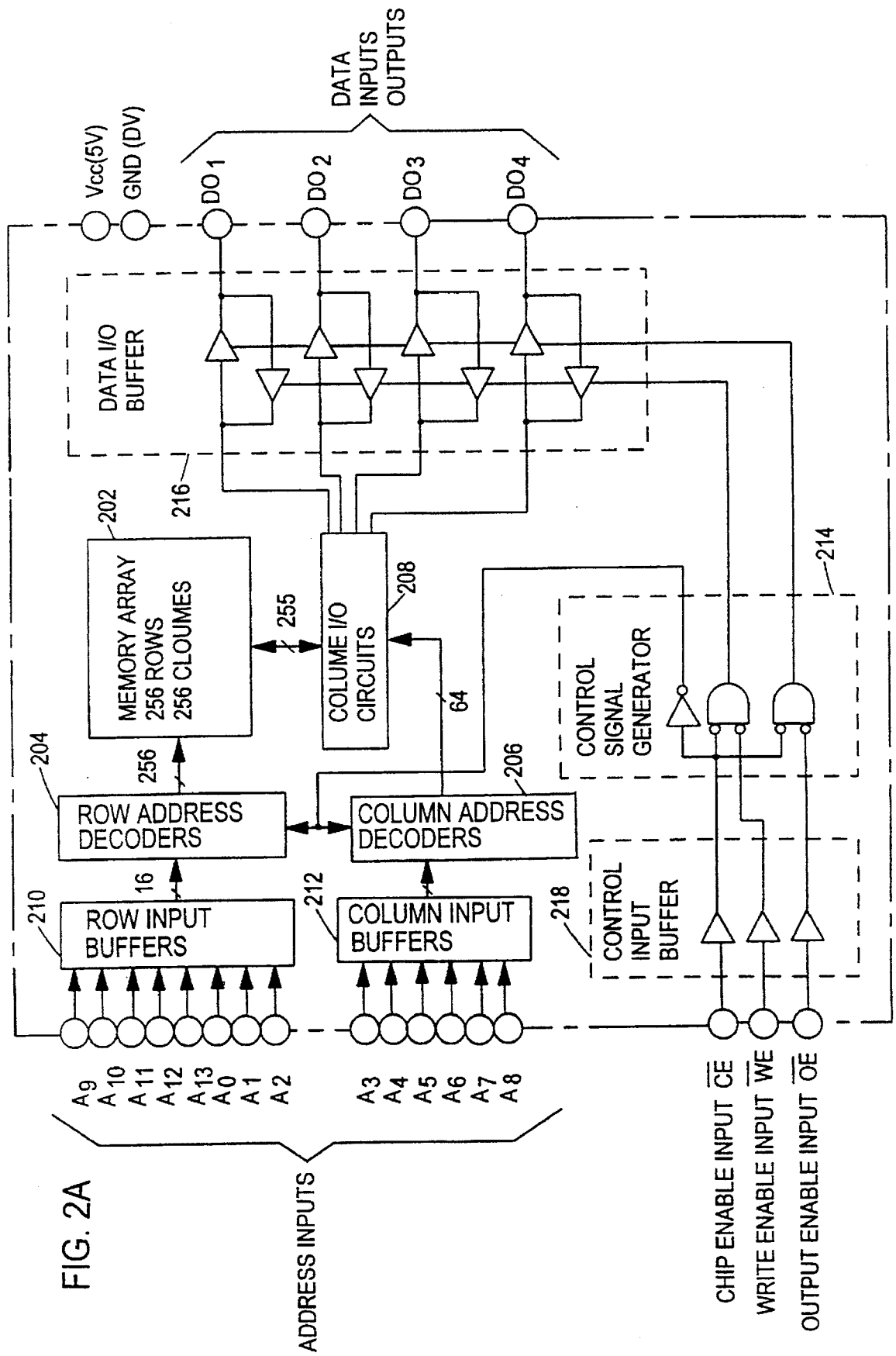
FIG. 2a is a block diagram illustrating each of the SRAM shown in FIG. 2.

Similarly, signal lines 10, 11 are connected to a $\overline{WE}$ terminal (write enable terminal) and an $\overline{OE}$ terminal (output enable terminal), respectively, of each of the SRAM's 2a to 2n through a unidirectional three-state buffer 18b. As shown in FIG. 2A, each of the SRAMs 2a–2n comprises a memory array 202 provided with row address decoders 204 and column address decoders 206 coupled to the memory array 202 via column input/output (I/O) circuits 208. Row input buffers 210 receive external address signals A0–A2 and A9–A13 to generate internal row address signals. Column input buffers 212 receive external address signals A3–A8 to generate internal column address signals. The row address decoder 204 designated by the internal row address signals is selected to apply a word line drive signal onto the corresponding word line. One column address decoder is provided for each four columns (bit line pairs). The column address decoder 206 designated by the internal column address signals is selected to generate an active column select signal. The column I/O circuits 208 select four columns in the memory array in response to the active column select signal. The row and column address decoders are enabled when a chip enable input $\overline{CE}$ is active at a low level. The active state of the chip also enables a control signal generator 214 to control a data I/O buffer 216 for data reading and writing through data inputs/outputs DO1–DO4, in response to an output enable signal $\overline{OE}$ and a write enable signal $\overline{WE}$ supplied to the output and write enable input terminals $\overline{OE}$ and $\overline{WE}$, respectively. A write cycle is executed whenever the low level of the signal $\overline{WE}$ overlaps with the low level of the signal $\overline{CE}$. The data is latched into a cell of the memory array on the trailing edge of the signals $\overline{WE}$ or $\overline{CE}$ whichever occurs first. The output enable signal $\overline{OE}$ directly controls an output stage of the data I/O buffer 216. When the signal $\overline{OE}$ is set at a low level, the output stage is in a high-impedance state, and data contention in the data I/O bus is eliminated. A read cycle is executed by setting the signal $\overline{WE}$ at a high level and the signal $\overline{OE}$ at a low level, while the signal $\overline{CE}$ is in an active state. A control input buffer 218 is provided to interface the control inputs $\overline{CE}$, $\overline{OE}$ and $\overline{WE}$ with the control signal generator 214. The signal line 11 is also connected to a DIR terminal (direction control terminal) of a bidirectional three-state buffer 19 through the unidirectional three-state buffer 18b. A signal line 9 is connected to an $\overline{E}$ terminal (enable terminal) of an address decoder 3 through the unidirectional three-state buffer 18b and to an $\overline{E}$ terminal of the bidirectional three-state buffer 19. An I/O data bus 12 is connected to a data input/output terminal of each of the SRAM's 2a to 2n through the bidirectional three-state buffer 19. A transistor 20 as power input cutoff means is provided between a power supply input line 14 and an internal power supply line 15. Turn-on/turn-off of the transistor 20 are controlled by a power supply voltage detecting circuit 21. The power supply voltage detecting circuit 21 is enabled or disabled in response to a card insertion/detachment signal applied from an external terminal unit (not shown) through a signal line 23. More specifically, when the card insertion/detachment signal is at "H" level, the power supply voltage detecting circuit 21 is enabled. When the power supply voltage detecting circuit 21 is enabled, the transistor 20 is turned on if input of electric power from the terminal unit attains a prescribed value. Thus, the input of electric power to the power supply input line 14 is supplied to an internal power supply line 15. At the same time, the power supply voltage detecting circuit 21 activates, that is, sets to "H" level an opening/closing control signal for the address decoder 3 and the unidirectional three-state buffers 18a and 18b. The opening/closing control signal of "H" level is applied to each of E terminals (i.e. each enable terminals) of the address decoder 3, the unidirectional three-state buffers 18a and 18b through the signal line 24. Consequently, the address decoder 3 and the unidirectional three-state buffers 18a and 18b are conducted. On the other hand, the bidirectional three-state buffer 19 is conducted when the $\overline{E}$ terminal is at "L" level, whereby data is transmitted to the I/0 data bus 12. On this occasion, when the DIR terminal of the bidirectional three-state buffer 19 is at "L" level, the bidirectional three-state buffer 19 reams stored data of the SRAM's 2a to 2n, and when the DIR terminal is at "H" level, it writes data in the SRAM's 2a to 2n. The bidirectional three-state buffer 19 is brought into a floating state when the $\overline{E}$ terminal is at "H" level, so that transmission of data through the I/O data bus 12 is interrupted. A pull-down resistor 22 serves to ground a pull-up resistor 17 connected to each bus and each of signal lines 8 to 12 when there is no input of power from the terminal unit, and to lower input/output impedances of the respective buffers 18a, 18b and 19. In FIG. 2, the opening/closing control signal outputted from the power supply voltage detecting circuit 21 to the signal line 24 is an "H" active signal (i.e. a signal activated at "H" level).

The unidirectional three-state buffers 18a, 18b and the bidirectional three-state buffer 19 not only have not only a simple switching function but also have a drive function of shaping data or signals flowing therein and enhancing the levels thereof.

Next, the operation of the embodiment shown in FIG. 2 will be described with regard to three operation modes as described below.

Operation mode 1: operation in the case where the terminal unit and the memory card are connected Operation mode 2: operation in the case of detaching the memory card from the terminal unit Operation mode 3: operation in the case of inserting the memory card into the terminal unit First, the operation mode 1 will be described. The card insertion/detachment signal inputted from the terminal unit to the signal line 23 is raised to "H" level, so that it is applied to the power supply voltage detecting circuit 21. The power supply voltage detecting circuit 21 is enabled to operate when the card insertion/detachment signal is at "H" level as described previously. When input of power is applied from the terminal unit to the power supply input line 14 and the voltage attains a prescribed value, the power supply voltage detecting circuit 21 detects that and introduces base current to the transistor 20. Thus, the transistor 20 is conducted. As a result, the power supply voltage supplied to the power supply input line 14 is applied to the internal power supply line 15 and at the same time the power supply voltage detecting circuit 21 raises to "H" level the opening/closing control signal to be provided to the signal line 24. In consequence, the address decoder 3 and the unidirectional three-state buffers 18a and 18b are conducted.

Normally, when the SRAM's 2a to 2n are not accessed, the chip enable signal $\overline{CE}$, the write enable signal $\overline{WE}$ and the output enable signal $\overline{OE}$ are all in an inactive state, namely, at "H" level. Accordingly, SRAM selection signals outputted from the address decoder 3 to the signal lines 13a to 13m all attain "H" level and none of the SRAM's 2a to 2n is selected. The $\overline{E}$ terminal of the bidirectional three-state buffer 19 is also at "H" level. In this state, operation of writing data into an arbitrary SRAM 2k from the terminal unit through the data bus 12 is performed in the below described manner.

When a write address is supplied to the address bus 8 to set the chip enable signal $\overline{CE}$ to "L" level, the address decoder 3 sets to "L" level the SRAM selection signal to the corresponding SRAM 2k. In a period of "L" level of the SRAM selection signal, the write enable signal $\overline{WE}$ is set to "L" level, whereby data inputted from the I/O data bus 12 on that occasion can be written in the SRAM 2k. In this case, the output enable signal $\overline{OE}$ is at "H" level.

Next, in the case of reading stored data of the SRAM 2k onto the terminal unit, a read address is supplied to the address bus 8 to cause the chip enable signal $\overline{CE}$ to be at "L" level. Consequently, the address decoder 3 changes to "L" level the SRAM selection signal to the corresponding SRAM 2k. In a period of "L" level of the SRAM selection signal, the output enable signal $\overline{OE}$ is lowered to "L" level, whereby the data stored in a memory cell of the SRAM 2k corresponding to the read address can be read onto the terminal unit.

In the bidirectional three-state buffer 19, a direction where communication of data can be made is controlled in response to the output enable signal $\overline{OE}$ inputted to the DIR terminal of the buffer 19 through the signal line 11. More specifically, when the output enable signal $\overline{OE}$ is at "H" level, the direction where transmission of data can be made is a direction from the terminal unit to the SRAM's 2a to 2n, and when the output enable signal $\overline{OE}$ is at "L" level, the above mentioned direction is a direction from the SRAM's 2a to 2n to the terminal unit.

The above described write and read operations are the same as the operations of a single SRAM and those operations are generally well known. In this operation mode 1, the voltage of the internal power supply line 15 is higher than that of the battery 6 and consequently the voltage supply path of the battery 6 is cut off by the protection diode 4. Accordingly, electric current does not flow into the battery 6 and the consumption thereof can be prevented. In the above described write and read operations, the signals and data transmitted between the respective SRAM's 2a to 2n and the terminal unit are shaped by the drive function of the buffers 8a, 8b and 19, whereby the signal levels are enhanced. Thus, even if the capacity of the connection lines is increased by an increase of the number of SRAM's, delay in transmission of signals and data can be prevented and it becomes possible to realize a memory card circuit of high speed having excellent electric characteristics.

If the voltage of the power supply input line 14 becomes lower than the prescribed value, the power supply voltage detecting circuit 21 detects the lowering and changes to "L" level the opening/closing control signal to the address decoder 3 the unidirectional semi-state buffers 18a and 18b immediately, so that the transistor 20 is brought into a non-conductive state. In consequence, the address decoder 3 is disabled and all the SRAM's 2a to 2n are in the non-selected state. At this time, the unidirectional three-state buffers 18a and 18b are brought into the non-conductive state in response to the opening/closing control signal of "L" level. Accordingly, the voltage at the $\overline{E}$ terminal of the bidirectional three-state buffer 19 is pulled up by the pull-up resistor 17, so as to be at "H" level. As a result, the bidirectional three-slate buffer 19 is in the floating state. In the meantime, voltage is supplied from the battery 6 to the internal power supply line 15 and the stored data in the respective SRAM's 2a to 2n are maintained. On this occasion, since the internal power supply 15 is cue off from the terminal unit by the unidirectional three-state suffer 18b even if the potential of the signal line 9 or 10 is at "L" level on the side of the terminal unit, the battery 6 does not discharge electricity to the terminal unit.

Next, the operation more 2 will be described. In the case of detaching the memory card from the terminal unit, the card insertion/detachment signal (to be supplied to the signal line 23) is set to "L" level on the side of the terminal unit, whereby it becomes possible to prevent damage to the stored data of the SRAM's 2a to 2n. More specifically, when the card insertion/detachment signal is set to "L" level, the power supply voltage detecting circuit 21 and the address decoder 3 are disabled, so that the SRAM selection signals to the SRAM's 2a to 2n are all raised to "H" level. The unidirectional three-state buffers 18a and 18b and the bidirectional three-state buffer 19 are also disabled. Thus, the signal paths between the terminal unit and the SRAM's 2a to 2n are entirely cut off. Accordingly, the SRAM's 2a to 2n are not affected by noises due to a signal level change, a time lag or the like caused in the connection portion (normally the connector) between the terminal unit and the memory card. As a result, the stored data of the SRAM's 2a to 2n can be ensured without being damaged.

Thereafter, since the terminal unit applies no input of power to the power supply input line 14, the power supply input line 14 is pulled down to the ground voltage through the resistor 22. Thus, the power supply voltage detecting circuit 21 maintains the off state of the transistor 20 and the non-conductive states of the address decoder 3 and the unidirectional three-state buffers 18a and 18b. Accordingly, even after the memory card is completely detached from the terminal unit, the SRAM's 2a to 2n are cut off from outside and the stored contents can be protected. In this case, voltage for maintaining the stored contents is supplied from the battery 6 to the SRAM's 2a to 2n through the internal power supply line 15. The respective buses and signal lines 8 to 12 which are connected to the power supply input line 14 through the pull-up resistor 17 have their potentials pulled down to the ground potential since the power supply input line 14 is grounded through the resistor 22 at this time. Thus, the input/output impedances of the buffers 18a, 18b and 19 viewed from outside of the memory card are reduced, making in possible to increase electrostatic strength and electromagnetic field strength. In this operation mode 2, pull-down means is formed by cooperation of the resistor 17 as the pull up means in the operation mode 1 and the resistor 22, in corporation. Since a resistor having a large resistance value is normally used as the resistor 17, a resistor having a small resistance value may be used as the resistor 22, which makes it possible to reduce the cost of the memory card circuit.

Figure 3:
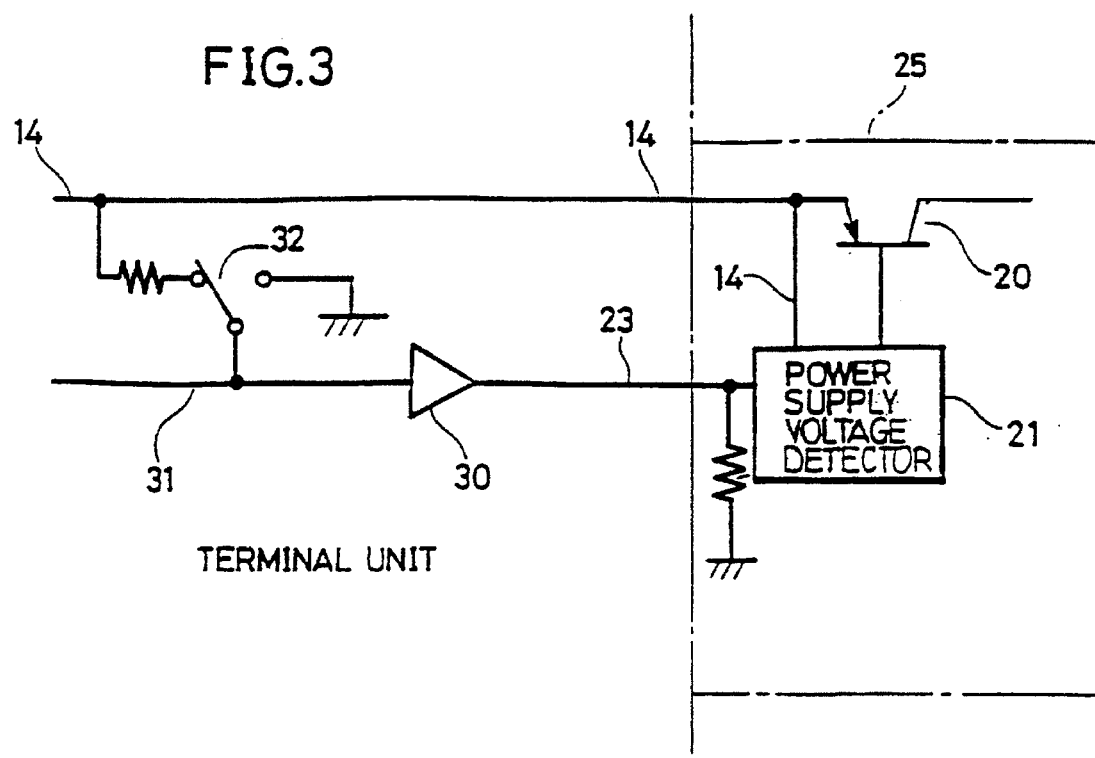
FIG. 3 is a diagram showing an example of a method of inputting a card insertion/detachment signal from a terminal unit to a memory card circuit in connection with the embodiment shown in FIG. 2.
Figure 4:
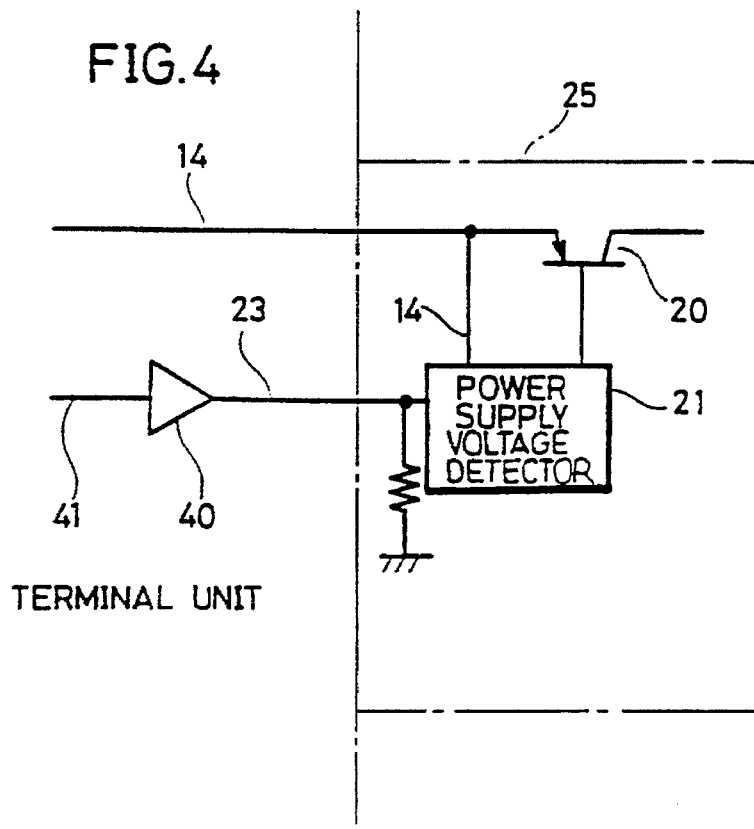
FIG. 4 is a circuit showing another example of a method of inputting a card insertion/detachment signal from a terminal unit to the memory card circuit in connection with the embodiment shown in FIG. 2.

A method for generating the card insertion/detachment signal in the terminal unit is for example a method by using a switch as shown in FIG. 3 or a method by control of a CPU of the terminal unit as shown in FIG. 4. In each of those figures, the right portion constitutes a part of the memory card circuit 25 and the left portion constitutes a part of the terminal unit. In the case of the terminal unit of FIG. 3, the construction includes a buffer 30, a switch 32 and a signal line 31 to which an interruption signal of the CPU (not shown) is applied or which is connected to an I/O port (not shown). In the case of the terminal unit of FIG. 4, the construction includes a buffer 40, and a signal line 41 which receives a signal from a software control portion (not shown) of the CPU. According to those methods, the card inserting/detachment signal is supplied to the memory card circuit 25 through the signal line 23 and is also supplied to an interruption terminal or an I/O terminal of the CPU of the terminal unit. In consequence, accessing (writing, reading) of the memory card in the terminal unit can be stopped, which makes it possible to completely prevent erroneous writing or erroneous reading at the time of insertion/ detachment of the card.

Finally, the operation mode 3, namely, the operation in the case of inserting the memory card detached in the operation mode 2 into the terminal unit will be described. In the operation mode 2, the data and signal transmission paths between the terminal unit and the SRAM's 2a to 2n are entirely cut off. Consequently, even if the terminal unit is in the active state (in the conducted state), the stored data in the respective SRAM's 2a to 2n are not damaged by insertion of the memory card. When input of power from the terminal unit to the power supply input line 14 attains a prescribed value, the transistor 20 is turned on by the power supply voltage detecting circuit 21 and the address decoder 3, the unidirectional three-state buffers 18a, 18b and the bidirectional three-state buffer 19 are conducted. Since the subsequent operation is the same as that in the above described operation mode 1, the description thereof is not repeated.

Figure 5:
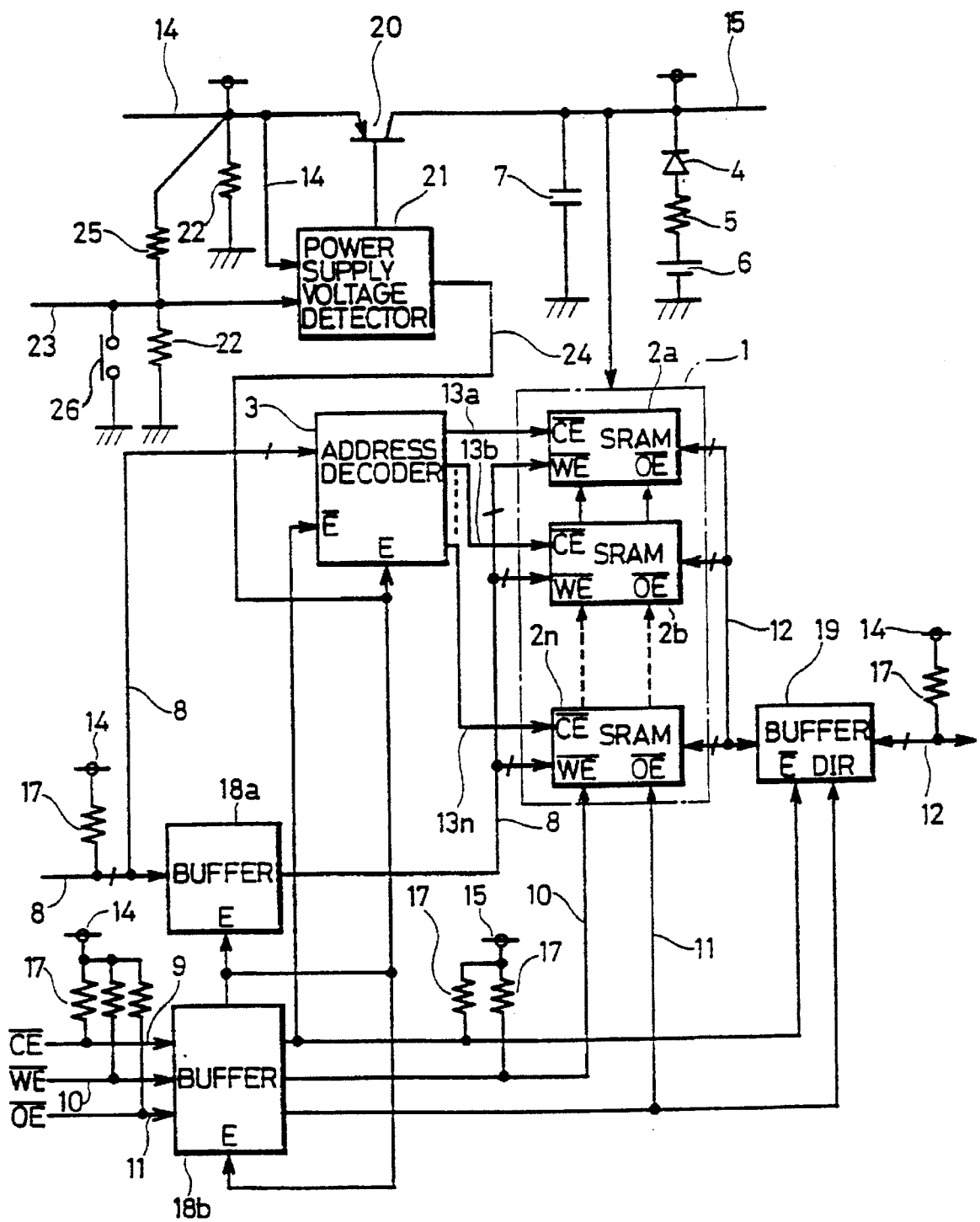
FIG. 5 is a circuit diagram showing a construction of another embodiment of the present invention.

Referring now to FIG. 5, another embodiment of the present invention will be described in this embodiment, the card insertion/detachment signal is not applied from the terminal unit to the power supply voltage detecting circuit 21. Instead, a card insertion/detachment switch 26 is provided in an arbitrary position on the memory card. The power supply voltage detecting circuit 21 is enabled or disabled by control of manual operation of the card insertion/detachment switch 26. More specifically, a card insertion/detachment signal from the card insertion/ detachment switch 26 is supplied to the power supply voltage detecting circuit 21 through the signal line 23 The card insertion/detachment signal from the card insertion/ detachment switch 26 is also supplied to an interruption terminal or an I/O port of a CPU (not shown) of the terminal unit through the signal line 23. A resistor 25 provided between the power supply input line 14 and the signal line 23 cooperates with the resistor 22 to constitute a voltage dividing circuit when the card insertion/detachment switch 26 is opened. The voltage of the signal line 23 is raised to "H" level by resistance division by means of the voltage dividing circuit. For this purpose, if the resistance value of the resistor 25 is R1 and that of the resistor 22 is R2, the respective resistance values are selected so as to satisfy a relation of R1<R2. The other construction is the same as that in the embodiment shown in FIG. 2. The portions corresponding to those in FIG. 2 are assigned identical reference numerals and the description thereof is not repeated.

The embodiment of FIG. 5 constructed as described above performs almost the same operation in the embodiment of FIG. 2. Therefore, in the following description of the operation of the embodiment of FIG. 5, only different features from the operation of the embodiment of FIG. 2 will be described.

In the above mentioned operation mode 1 (i.e., the operation in the case where the terminal unit and the memory card are connected), the card insertion/detachment switch 26 is opened. Accordingly, the potential of the signal line 23 is maintained at "H" level, by resistance division by means of the resistors 25 and 22. Thus, the card insertion/detachment signal of "H" level is supplied to the power supply voltage detecting circuit 21 through the signal line 2 and the power supply voltage detecting circuit 21 is enabled. Therefore, the power supply voltage detecting circuit 21 performs the same control operation as that in the embodiment of FIG. 2 with respect to the transistor 20, the address decoder 3, and the unidirectional three-state buffers 18a and 18b dependent on whether the power supply voltage supplied to the power supply input line 14 is higher than a prescribed value or not.

Next, in the above mentioned operation mode 2 (i.e. the operation in the case of detaching the memory card set in the operation mode 1), the card insertion/detachment switch 26 is closed immediately before the memory card is detached from the terminal unit. As a result, the signal lien 23 is grounded and the card insertion/detachment signal of "L" level is supplied to the power supply voltage detecting circuit 21. Thus, the power supply voltage detecting circuit 21 is disabled. As a result, the SRAM selection signals to the respective SRAM's 2a to 2n are all at "H" level and the unidirectional three-state buffers 18a, 18b and the bidirectional three-state buffer 19 are all in the non-conductive state. Thus, since the SRAM's 2a to 2n are cut off from outside, the stored contents of the SRAM's 2a to 2n can be protected even if the memory card is detached from the terminal unit. The card insertion/detachment signal of "L" level is supplied to the power supply voltage detecting circuit 21 and is also supplied to the interruption terminal or the I/O terminal of the CPU (not shown) of the terminal unit. In consequence, accessing (writing, reading) of the memory card in the terminal unit can be stopped, making it possible to completely prevent erroneous writing or erroneous reading at the time of insertion or detachment of the card.

Next, in the above mentioned operation mode 3 (i.e. the operation in the case of inserting the memory card into the terminal unit), the card insertion switch 26 is closed in advance and the signal line 23 is grounded. Thus, the memory is inserted into the terminal unit in the state where the power supply voltage detecting circuit 21 is disabled. Consequently, since the respective SRAM's 2a to 2n are cut off from outside, the stored data of the SRAM's 2a to 2n can be maintained without being damaged even if the terminal unit is in the active state (in the conducted state).

Although the semiconductor memories used as the storage means are SRAM's in the embodiments of FIGS. 2 and 5, the present invention is applicable to other types of semiconductor memories. For example, the present invention is applicable to one-time programmable (OTP) ROM's, mask ROM's, or EEPROM's and in such cases the same meritorious effects as in the above described embodiments can be obtained. If nonvolatile memories are used as the semiconductor memories, the backup internal power supply, namely, the diode 4, the resistor 5 and the battery 6 are not required.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A memory card circuit provided in a portable card medium and electrically connected with a terminal unit to process data when said card medium is inserted in said terminal unit and supplied with a power signal from said terminal unit, comprising:

a data storage chip to be accessed from said terminal unit when said card medium is inserted in said terminal unit, said storage chip having data storage devices data input and output buffer, and control buffer for receiving write and read control signals from said terminal unit, external buffers between said terminal unit and said storage chip to isolate said data storage devices, said input and output buffer and said control buffer from said terminal unit; and said external buffers being operable for being activated into a conductive state when a voltage inputted from said terminal unit is equal to or higher than a prescribed voltage value, to enable the transmission of data and said control signals between said terminal unit and said storage chip and deactivated into a non-conductive state when the voltage signal inputted from said terminal unit is lower than the prescribed voltage value, to cut off said storage chip from external signals.

2. A memory card circuit in accordance with claim 1, wherein said external buffers are controlled to be enabled and disabled in response to a card insertion/detachment signal supplied from said terminal unit and when said card medium is inserted into and detached from said terminal unit.

3. A memory card circuit in accordance with claim 1, further comprising:

a transistor switch for interrupting the input of voltage from said terminal unit simultaneously with the setting of said external buffers in the non-conductive state.

4. A memory card circuit in accordance with claim 3, further comprising a backup internal power supply for maintaining stored contents of said data storage chip when the input of voltage from said terminal unit is interrupted by said transistor switch.

5. A memory card circuit in accordance with claim 1, wherein a plurality of data storage chips are provided in said memory card circuit, and said external buffers have a drive function of enhancing levels of data and signals transmitted between said terminal unit and said data storage chips when said external buffers are in the conductive state.

6. A memory card circuit in accordance with claim 1, further comprising a resistor circuit coupled to said external buffers for lowering input/output impedance of said external buffers viewed from outside of said card medium when said card medium is in a state detached from said terminal unit.

7. A memory card circuit provided in a portable card medium and electrically connected with a terminal unit to process data when said card medium is inserted in said terminal unit and supplied with a power signal from said terminal unit, comprising:

a data storage including a plurality of memory chips to be accessed from said terminal unit when said card medium is inserted in said terminal unit, each memory chip having a data input and output buffer, and a control buffer for receiving a chip enable signal, and a write and read control signal, input and output terminals for said memory card circuit, external buffers between the terminal unit and the memory chips, for providing an interface for transmission of data, control and enable signals between said terminal unit and said plurality of memory chips;

a voltage detector, responsive to the power signal and a separate card insertion/detachment signal for determining when a level of the power signal inputted from said terminal unit is equal to or higher than a prescribed voltage value, said voltage detector determining that said power signal is equal to or higher than the prescribed voltage value and that the card insertion/detachment signal indicates the card is inserted;

an address decoder responsive to an address signal from said terminal unit and to an output signal of said voltage detector for selecting said memory chips, said address decoder preventing said memory chips from being accessed when said power signal is lower than said prescribed voltage value; and said external buffers being deactivated by said voltage detector into a non-conductive state when the power signal inputted from said terminal unit to said voltage detector is lower than the prescribed voltage value, to cut off said memory chip from the data and, the write and read control signal.

8. A memory card circuit in accordance with claim 7, wherein said external buffers are controlled to be enabled and disabled in response to a card insertion/detachment signal supplied from said terminal unit and when said card medium is inserted into and detached from said terminal unit.

9. A memory card circuit in accordance with claim 7, further comprising:

transistor switch for interrupting the input of voltage from said terminal unit simultaneously with the setting of said external buffers in the non-conductive state.

10. A memory card circuit in accordance with claim 9, further comprising a backup internal power supply for maintaining stored contents of said data storage when the input of voltage from said terminal unit is interrupted by said transistor switch.

11. A memory card circuit in accordance with claim 7, wherein said external buffers have a drive function of enhancing levels of data and signals transmitted between said terminal unit and said plurality of memory chips when said external buffers are in a conductive state.

12. A memory card circuit in accordance with claim 9, further comprising a resistor circuit coupled to said external buffers for lowering input/output impedance of said external buffers viewed from outside of said card medium when said card medium is in a state detached from said terminal unit.

13. A memory card circuit provided in a portable card medium and electrically connected with a terminal unit to process data when said card medium is inserted in said terminal unit and supplied with a power signal from said terminal unit, comprising:

a data storage chip to be accessed from said terminal unit when said card medium is inserted in said terminal unit, said data storage chip having a data input and output buffer and a control buffer for receiving data and control signals, external buffers between said terminal unit and said data storage chip for providing an interface for transmission of data and enable signals between said terminal unit and said data storage chip, and voltage detector responsive to the power signal for determining when a level of the power signal inputted from said terminal unit is equal to or higher than a prescribed voltage value, said external buffers being disabled when the power signal inputted from said terminal unit to said voltage detector is lower than the prescribed voltage value, to cut off said data storage chip from external signals, said external buffers comprising a unidirectional buffer and a bidirectional buffer coupled to said unidirectional buffer for writing data into said data storage chip when a direction control signal from said unidirectional buffer is at a first logic level, and for reading data from said data storage chip When the direction control signal is at a second logic level.

14. A memory card circuit provided in a portable card medium and electrically connected with a terminal unit when said card medium is inserted in said terminal unit and supplied with a power voltage signal from said terminal unit, comprising:

a plurality of memory chaps provided in parallel and accessed selectively from said terminal unit when said card medium is inserted in said terminal unit, each of said memory chips having a data input and output buffer and a control buffer for receiving data and an enable signal;

a data terminal electrically connected with said terminal unit when said card medium is inserted in said terminal unit;

signal terminals electrically connected with said terminal unit when inserted therein;

first buffers between said signal terminals and said plurality of memory chips for providing an interface for transmission of an address signal and the enable signal from said terminal unit to said plurality of memory chips; and a second external buffer between said data terminal and said plurality of memory chips for providing an interface for transmission of the data between said plurality of memory units and said terminal unit;

said first and second external buffers being operable for being deactivated into a non-conductive state when said power voltage signal is lower than a predetermined level to isolate said plurality of memory chip from said signal terminals and said data terminal.

15. The memory card circuit according to claim 14, wherein said first and second external buffers are deactivated into the non-conductive state when said card medium is detached from said terminal unit.

16. A memory card circuit including signal input terminals receiving external signals and a data terminal for supplying data externally, comprising:

a data storage chip for storing data and including a control buffer having an enable node for receiving an enable signal, and a data buffer having a data output node for supplying data read from said data storage chip, said data output node being brought into a high impedance state when said enable node receives said enable signal in a disabled state;

said external signals including a signal corresponding to said enable signal;

first external buffers between said data storage chip and said signal input terminals for buffering said external signals to generate internal signals for application to said data storage chip, said first external buffers supplying said enable signal in response to a corresponding external signal;

a second external buffer between said data output node and said data output terminal for receiving data at said output node for transmission to said data terminal;

a power supply node receiving an external supply voltage;

said first and second external buffers being deactivated into a non-conductive state when said external supply voltage is lower than a predetermined voltage value to isolate said data storage chip from said signal input terminals and said data terminal, and to transfer said enable signal into said disabled state.

17. The memory card circuit according to claim 16, further comprising a terminal receiving a card insertion/detachment signal indicating whether said memory card circuit is inserted into or detached from a terminal unit, and wherein said first and second external buffers are transferred into the non-conductive state in response to said card insertion/detachment signal indicating detachment of said memory card circuit from said terminal unit.

18. The memory card circuit according to claim 16, further comprising:

an internal power supply line for transferring a power supply voltage, a transistor switch responsive to a predetermined value of said external supply voltage for inhibiting transfer of said external supply voltage received at said power supply node onto said internal power supply line.

19. The memory card circuit according to claim 18, further comprising:

a resistor circuit provided at a node between said signal input terminals and said first external buffers and at a node between said data output terminal and said second external buffer for preventing said signal input terminals and said data terminal from being brought into a high impedance state.

20. The memory card circuit according to claim 16, wherein said data storage chip includes a plurality of memory units provided in parallel and accessible independently of each other, and wherein said first external buffers are coupled to an address decoder responsive to an address signal received at a signal input terminal among said signal input terminals bringing a memory unit among said plurality of memory units into an enable state in which said memory unit is operated to be externally accessed.

21. The memory card circuit according to claim 20, wherein each said external second buffer is provided in common to said plurality of memory units.

22. The memory card circuit according to claim 16, wherein said first external buffers are responsive to the external supply voltage for disabling said second external buffer.

23. The memory card circuit according to claim 16, wherein said data output node also receives data to be written, and said second external buffer is a bidirectional buffer controlled by said first external buffers that define a direction of data transfer through said bidirectional buffer when enabled.

* * * * *